United States Patent
Lin et al.

(10) Patent No.: US 8,569,086 B2
(45) Date of Patent: Oct. 29, 2013

(54) SEMICONDUCTOR DEVICE AND METHOD OF DICING SEMICONDUCTOR DEVICES

(75) Inventors: Jing-Cheng Lin, Hsin-Chu (TW); Chih-Wei Wu, Zhuangwei Township (TW); Szu Wei Lu, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 13/216,825

(22) Filed: Aug. 24, 2011

(65) Prior Publication Data

US 2013/0049234 A1    Feb. 28, 2013

(51) Int. Cl.
*H01L 21/00* (2006.01)

(52) U.S. Cl.
USPC ................................ 438/33; 438/68; 438/113

(58) Field of Classification Search
USPC ............................................. 438/33, 68, 113
See application file for complete search history.

(56) References Cited

U.S. PATENT DOCUMENTS

| | | | |
|---|---|---|---|
| 4,990,462 A | 2/1991 | Sliwa, Jr. | |
| 5,075,253 A | 12/1991 | Sliwa, Jr. | |
| 6,355,501 B1 | 3/2002 | Fung et al. | |
| 6,362,077 B1 * | 3/2002 | Aspar et al. | 438/458 |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,780,746 B2 * | 8/2004 | Kinsman et al. | 438/612 |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,943,067 B2 | 9/2005 | Greenlaw | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,307,005 B2 | 12/2007 | Kobrinsky et al. | |
| 7,402,442 B2 | 7/2008 | Condorelli et al. | |
| 7,410,884 B2 | 8/2008 | Ramanathan et al. | |
| 7,494,845 B2 | 2/2009 | Hwang et al. | |
| 7,510,910 B2 * | 3/2009 | Yamagata | 438/118 |
| 7,528,494 B2 | 5/2009 | Furukawa et al. | |
| 7,566,638 B2 * | 7/2009 | Shizuno | 438/463 |
| 7,838,424 B2 * | 11/2010 | Karta et al. | 438/689 |
| 7,892,949 B2 * | 2/2011 | Abe et al. | 438/462 |
| 7,897,488 B2 * | 3/2011 | Watanabe et al. | 438/463 |
| 7,968,432 B2 * | 6/2011 | Tamura et al. | 438/463 |
| 8,293,584 B2 * | 10/2012 | Guillermo et al. | 438/114 |
| 8,314,013 B2 * | 11/2012 | Fujii et al. | 438/460 |

(Continued)

*Primary Examiner* — James Mitchell
(74) *Attorney, Agent, or Firm* — Slater & Matsil, L.L.P.

(57) ABSTRACT

A method and apparatus for separating a substrate into individual dies and the resulting structure is provided. A modification layer, such as an amorphous layer, is formed within the substrate. A laser focused within the substrate may be used to create the modification layer. The modification layer creates a relatively weaker region that is more prone to cracking than the surrounding substrate material. As a result, the substrate may be pulled apart into separate sections, causing cracks the substrate along the modification layers. Dice or other components may be attached to the substrate before or after separation.

18 Claims, 6 Drawing Sheets

(56) References Cited

U.S. PATENT DOCUMENTS

| | | | |
|---|---|---|---|
| 8,389,384 B2* | 3/2013 | Sakamoto et al. | 438/463 |
| 2007/0105345 A1* | 5/2007 | Kurosawa | 438/460 |
| 2007/0111390 A1* | 5/2007 | Komura et al. | 438/113 |
| 2007/0111478 A1* | 5/2007 | Komura et al. | 438/462 |
| 2007/0148918 A1* | 6/2007 | Kinsman et al. | 438/460 |
| 2007/0155131 A1* | 7/2007 | Contes | 438/458 |
| 2009/0011543 A1* | 1/2009 | Karta et al. | 438/114 |
| 2009/0121337 A1* | 5/2009 | Abe et al. | 257/686 |
| 2009/0189279 A1* | 7/2009 | How | 257/737 |
| 2010/0078811 A1* | 4/2010 | Meyer-Berg | 257/738 |
| 2011/0006404 A1* | 1/2011 | Lee et al. | 257/620 |
| 2011/0183464 A1* | 7/2011 | Takahashi et al. | 438/108 |
| 2012/0211748 A1* | 8/2012 | Miccoli et al. | 257/52 |

\* cited by examiner

SEMICONDUCTOR DEVICE AND METHOD OF DICING SEMICONDUCTOR DEVICES

BACKGROUND

Semiconductor devices are used in many electronic and other applications. Semiconductor devices comprise integrated circuits that are formed on semiconductor wafers by depositing many types of thin films of material over the semiconductor wafers and patterning the thin films of material to form the integrated circuits.

Metallization layers are usually the top-most layers of semiconductor devices. While some integrated circuits have a single top layer of metallization, other integrated circuits comprise multi-level interconnects, wherein two or more metallization layers are formed over a semiconductor wafer or workpiece. The metallization layers typically comprise layers of conductive lines separated from one another by an insulating material, also referred to as an inter-level dielectric (ILD) or an inter-metallization dielectric (IMD). Advanced semiconductor processes utilize inter-level dielectrics with low dielectric constants (k) and/or ultra-low dielectric constants (ULK) to minimize interconnect parasitic capacitances.

One of the challenges in semiconductor technology requires developing technologies with good product yield and reliability. However, materials with low dielectric constants generally have poor mechanical properties and are often brittle. Typically, a blade mounted on a rotating spindle coupled to a motor is used in a sawing process used to singulate or separate the wafer into individual dice. During the sawing process, stress may be created in the dicing lanes and adjacent regions. The stress may cause cracks that propagate into circuit elements causing fatal defects. While sawing to singulate the wafer into individual dice often causes chipping on the wafer and/or encapsulant, the low-k dielectric materials tend to be more prone to chipping and hence presents some unique challenges. Oftentimes designers utilize a wider scribe line to allow for the increase chipping, but this reduces the amount of silicon area available for IC fabrication.

These problems may also be present in 3D integrated circuits (ICs). Generally, 3D ICs may be fabricated by vertically stacking dies on a wafer (die-to-wafer) or a wafer on another wafer (wafer-to-wafer). Once stacked, a sawing process may be performed to form separate 3D IC packages. During the sawing process, chipping or cracking, particularly with the low-k dielectrics, may occur. The chipping or cracking may propagate to circuit elements causing failure.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments discussed herein are described in a specific context, namely, separation of packages, wherein each package comprises a dice mounted on a substrate, such as a wafer (with or without circuitry), an interposer, or other type of substrate. Aspects of this disclosure may be applied in other contexts. For example, aspects of the current disclosure may be used to singulate a single wafer into multiple dice.

Figure 1:
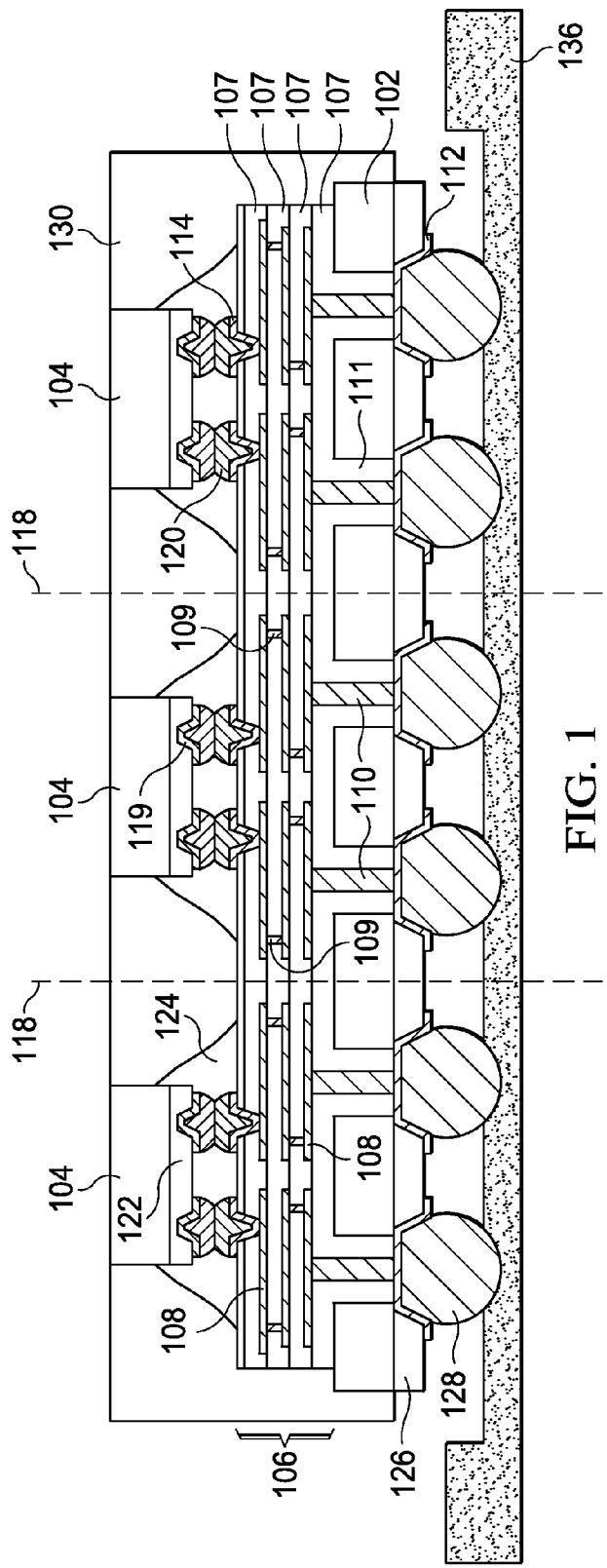
FIGS. 1-5 illustrate various intermediate stages in a manufacture of a semiconductor device.

Referring first to FIG. 1, there is shown a substrate 102 having a plurality of dice 104 mounted thereon in accordance with an embodiment. The substrate 102 may comprise a wafer having electrical circuits (not shown) formed thereon, an interposer (with or without active/passive devices), a mounting substrate, or the like. The substrate 102 may be a bulk silicon substrate, a semiconductor-on-insulator (SOI) substrate, silicon germanium, germanium, quartz, sapphire, glass and/or the like. In an embodiment, the substrate 102 has an interconnect structure 106 formed thereon. Generally, the interconnect structure 106 includes one or more dielectric layers 107, conductive layers (e.g., metallization layers) 108, and vias 109 that act to interconnect various electrical devices that may be formed on the substrate 102. The interconnect structure 106 may further act to interconnect select ones of the dice 104 to respective ones of a plurality of through-substrate vias (TSVs) 110.

In general, the dielectric layers 107 can be an oxide dielectric or other suitable dielectric materials in which the conductive layers 108 may be formed. In an embodiment, one or more of the dielectric layers 107 are formed of a low-k dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, including spinning, chemical vapor deposition (CVD), and plasma-enhanced CVD (PECVD). The conductive layers 108 may be formed from any suitable conductive material such as copper, nickel, aluminum, tungsten, titanium, combinations thereof, and/or the like.

The TSVs 110 provide electrically conductive pathways between contact pads 112 on a first side of the substrate 102 and contacts 114 on a second side of the substrate 102, via the interconnect structure 106. The TSVs 110 may be formed by any appropriate method. For example, openings may be formed extending into the substrate 102 by, for example, one or more etching processes, milling, laser techniques, or the like. The openings may include a liner 111, such as diffusion barrier layers, adhesion layers, isolation layer, and/or the like. The liner, for example, may comprise one or more layers of TaN, Ta, TiN, Ti, CoW, or the like, and the conductive material of the through-substrate vias may comprise, for example, copper, tungsten, aluminum, silver, combinations thereof, and/or the like, formed by an electro-chemical plating process.

It should be noted that the substrate 102 illustrates a substrate prior to dicing to form separate packages. In FIG. 1, lines 118 illustrate boundaries, e.g., scribe lines, at which the substrate 102 may be diced. It should also be noted that two scribe lines 118, and two contact pads 112 and two through-substrate vias 110 per package, are shown for illustrative purposes only, and that actual devices may have more or less corresponding structures.

The dice 104 may include any suitable circuitry for a particular application. In an embodiment, the dice 104 are electrically coupled to the substrate 102 in a flip-chip configuration such that contact pads 119 on the dice 104 face the substrate 102. The contact pads 119 of the dice 104 are electrically coupled to the contact 114 on the substrate 102 via first conductive bumps 120, which may be formed by lead free solder, eutectic lead, or the like. The dice 104 may include one or more passivation layers, such as passivation layer 122.

An optional underfill material 124 may be injected or otherwise formed in the space between the dice 104 and the substrate 102. The underfill material 124 may, for example, comprise a liquid epoxy, deformable gel, silicon rubber, or the like that is dispensed between the dice 104 and the substrate 102, and then cured to harden. This underfill material 124 is used, among other things, to reduce cracking in the first conductive bumps 120 and to protect the joints from contaminants.

Along the backside of the substrate 102, one or more passivation layers 126 and second conductive bumps 128 may be formed. The one or more passivation layers 126 may be formed of nitrides, oxides, polyimide, and the like, and the second conductive bumps 128 may be formed of a eutectic solder, lead free solder, or the like. The one or more passivation layers 126 may include, for example, stress buffer layers, redistribution layers, under bump metallization (UBM), and/or the like.

As illustrated in FIG. 1, the substrate 102 is mounted on a carrier membrane, such as a carrier tape 136. In an embodiment, the carrier tape 136 has an adhesive surface that is used to attach the substrate 102 to the carrier tape 136 via the second conductive bumps 128. In other embodiments, the substrate 102 may be attached prior to forming, for example, the second conductive bumps 128 and/or the one or more passivation layers 126. Other types of carrier membranes may be used; however, as explained in greater detail below, it may be desirable to utilize a flexible and or an elastic carrier membrane to facilitate the dicing process.

An encapsulant or overmold 130 may also be formed over the components to protect the components from the environment and external contaminants As one of ordinary skill in the art will realize, the above description provides a general description of the features of the embodiment and that numerous other features may be present. For example, other circuitry, liners, barrier layers, under-bump metallization configurations, redistribution layers (RDL), and the like, may be present. The above description is meant only to provide a context for embodiments discussed herein and is not meant to limit the disclosure or the scope of any claims to those specific embodiments. Any suitable process may be used to form the structures discussed above and will not be discussed in greater detail herein Referring now to FIG. 2, a notch 250 is formed in the encapsulant 130. In an embodiment, the notch 250 is formed using a saw 252, although other techniques may be used to create the notch 250. For example, in other embodiments a laser, an etching process, or the like may be used to create the notch 250. As another example, the notch 250 may be formed as part of the process of forming the encapsulant 130 by using a mold having the notch 250 formed therein.

Figure 2:
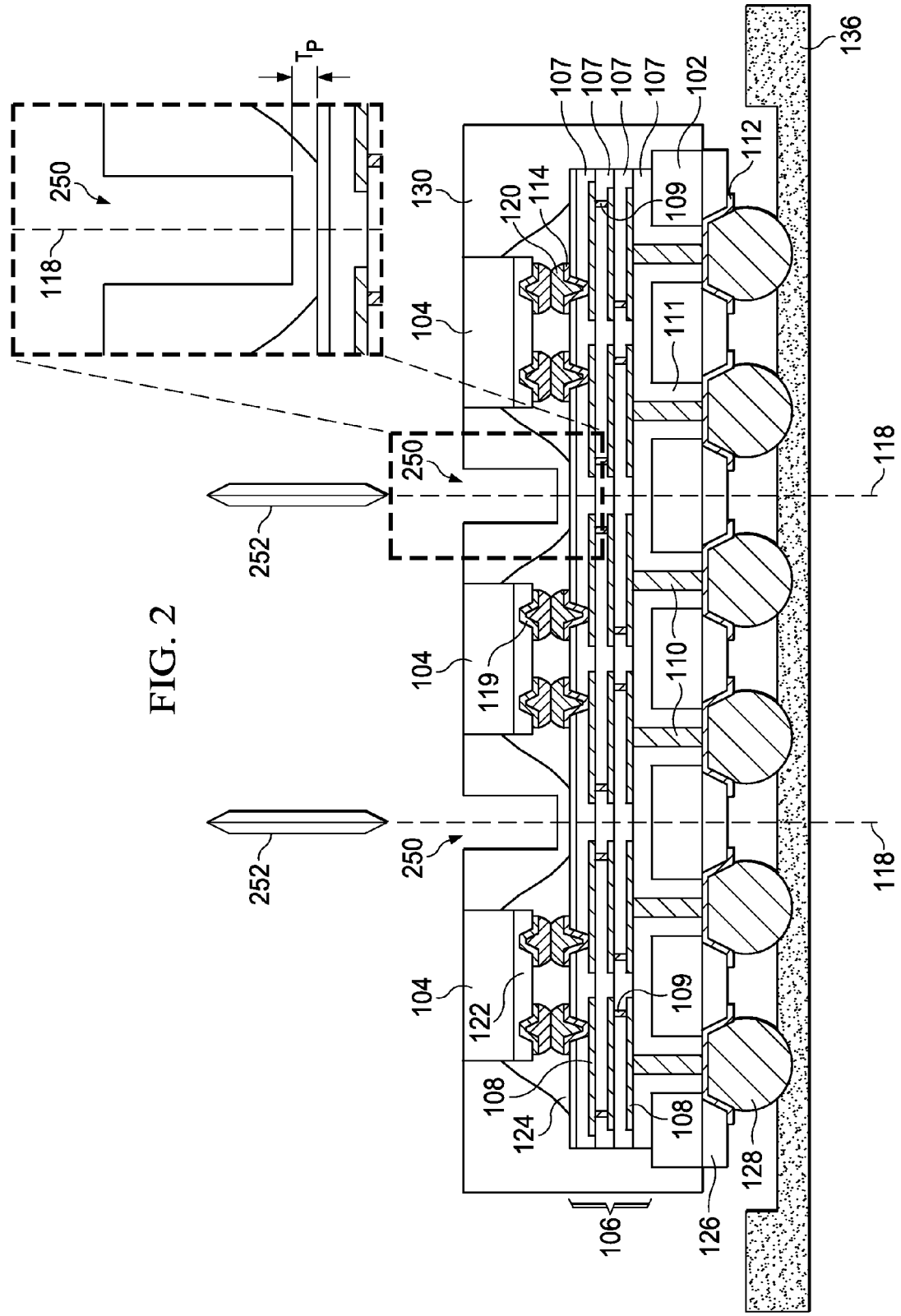

As illustrated in FIG. 2, in an embodiment, the notch extends partially through the encapsulant. In this embodiment the encapsulant remains over the surface of the interconnect structure 106, thereby preventing or reducing saw damage to the interconnect structure 106, including any low-k dielectric materials. The remaining encapsulant may have a thickness $T_p$ of about 5 μm to about 10 μm. The width of the notch may be adjusted to suit a particular application and distance between adjacent dice 104. However, it has been found that the width of the notch 250 may be very small, such as from about 1 μm to about 100 μm, due to the use of a modification layer and cracking method as discussed in greater detail below. Other widths, smaller or larger, may be used for the notch. In an embodiment, the notch 250 does not expose the underfill material 124 such that the underfill material 124 remains undamaged to protect the dice 104.

Figure 3:
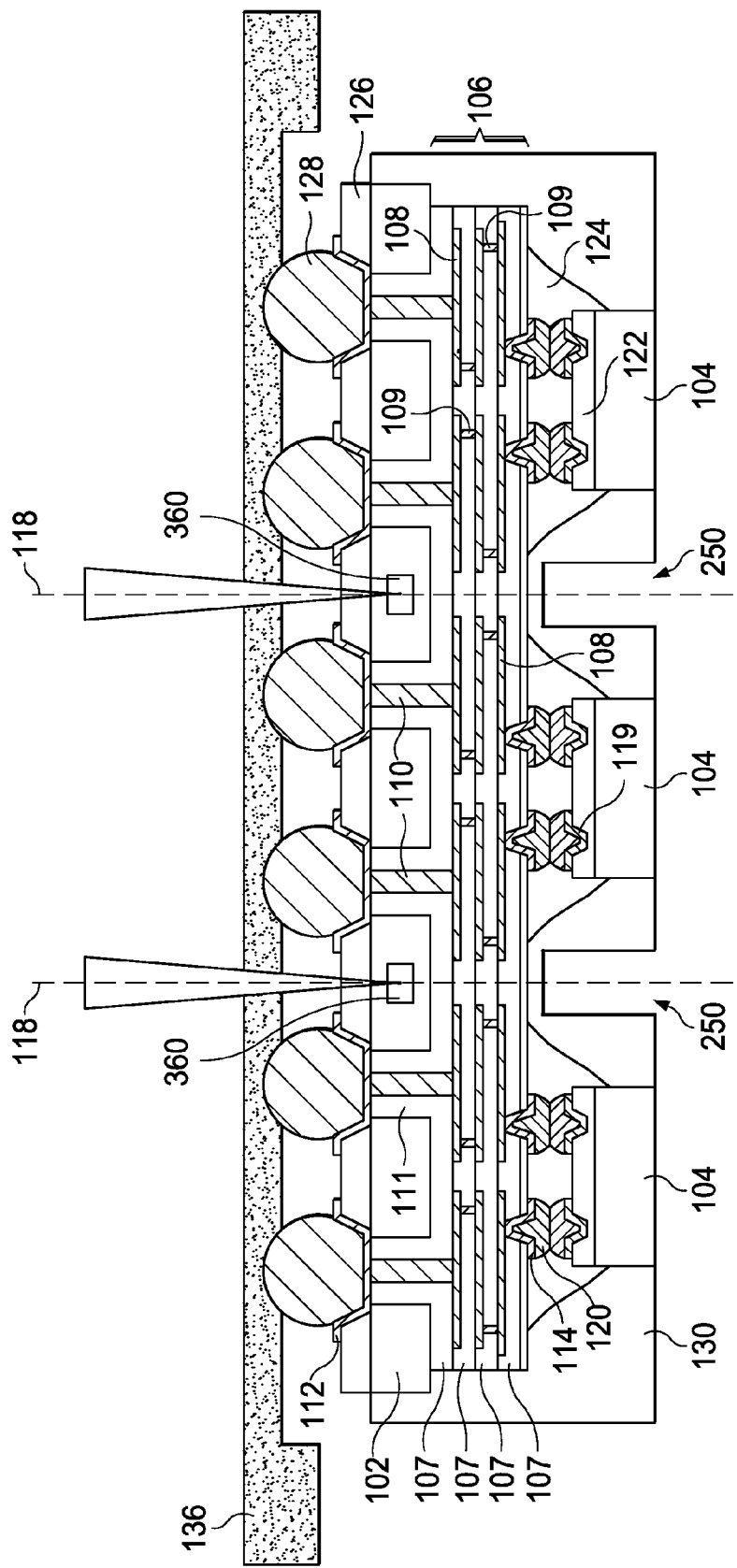

FIG. 3 illustrates formation of a modification layer 360 in accordance with an embodiment. The modification layer 360 represents a portion of the substrate 102 that has been altered to, for example, become more brittle. In the case of a silicon substrate or silicon interposer, the modification layer may be an amorphous region of the silicon substrate. The amorphous region of the silicon substrate is more brittle than the surrounding crystalline substrate. The brittle region creates a cracking line that will crack before causing damage to the crystalline substrate. In an embodiment, the modification layer 360 is formed using a laser, such as a diode-pumped solid state laser (DPSS laser), focused at a region within the substrate 102. When using a suitable wavelength, such as a 1064 nm wavelength laser, focused within the substrate 102, an amorphous layer is formed. In an embodiment, the modification layer 360 has a thickness of about 20 μm to about 25 μm. When a laser is used to form the modification layer 360, the width of the modification layer 360 (e.g., the width of the modification layer 360 along the direction between adjacent dice) may be very small, such as from about 1 μm to about 10 μm, but is sufficient for dicing as discussed below. These values may be adjusted as needed for various different types of substrates as well as thicknesses. The width of the modification layer 360 may be smaller or larger if desired.

The location of the modification layer 360 may be adjusted as necessary. In an embodiment in which the substrate 102 is a silicon interposer having a thickness of about 100 μm, the modification layer 360 may be a layer having a thickness of about 20 μm to about 25 μm located near the middle of the substrate 102. In other embodiments using thicker wafers, multiple passes with the laser focused at varying depths may be used to create a thicker modification layer or multiple modification layers. For example, it has been found that for a wafer having a thickness of about 200 μm, 5 passes is sufficient to create a modification layer 360 (having a thickness of about 50 μm to about 150 μm) to allow separation; for a wafer having a thickness of about 300 μm, 8 passes is sufficient to create a modification layer 360 (having a thickness of about 150 μm to about 250 μm) to allow separation; for a wafer having a thickness of about 400 μm, 12 passes is sufficient to create a modification layer 360 (having a thickness of about 250 μm to about 350 μm) to allow separation; and for a wafer having a thickness of about 625 μm, 19 passes is sufficient to create a modification layer 360 (having a thickness of about 475 μm to about 575 μm) to allow separation.

The location of the modification layer 360 may also be adjusted based upon the type of materials formed on the substrate 102. For example, in the case low-k dielectric layers are formed on the substrate 102, then it may be advantageous to place the modification layer 360 be placed nearer the low-k dielectric material, such as within about 1 μm to about 10 μm, although the modification layer 360 may be placed at different distances from the low-k dielectric material.

It should also be noted that the thermal effective zone may be reduced in embodiments such as those disclosed herein. Typically, for a laser ablation process a significant amount of heat is produced that could spread to the surrounding area and cause damage. Using a laser to form the modification layer, however, may avoid as large as thermal region, thereby reducing the thermal effective zone.

Figure 4:
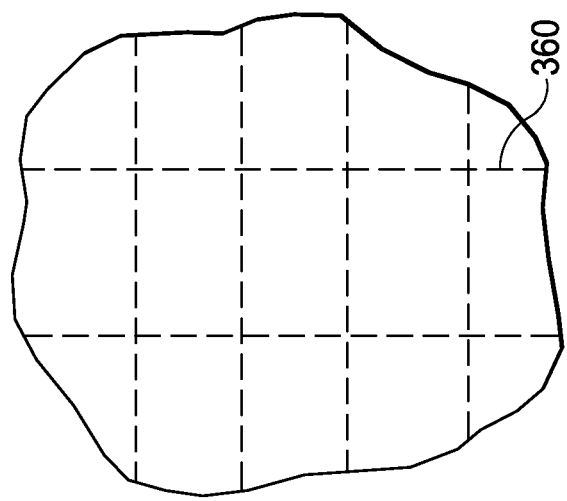

FIG. 4 is a plan view illustrating a pattern of the modification layer 360. As represented by the dotted line, the modification layer 360 is below the surface of the substrate 102. The pattern of the modification layer 360 defines the desired location of separation between adjacent packages.

Figure 5:
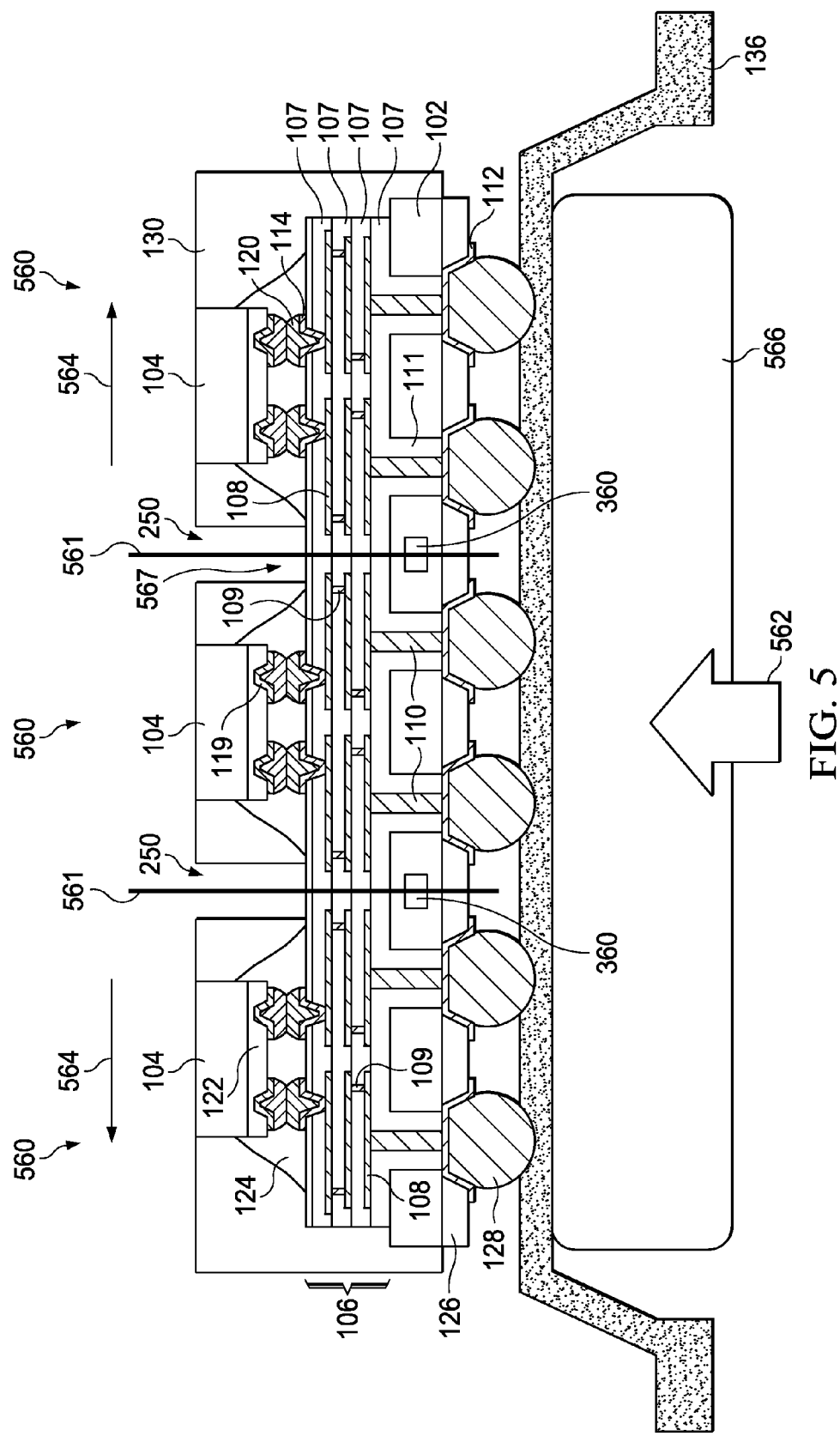

FIG. 5 illustrates a method of separating the substrate 102 into individual packages 560 along crack lines 561. In this illustrated embodiment, the carrier tape 136 is manipulated such that the distance between the individual packages 560 is increased. The carrier tape 136 may be manipulated by folding or, as illustrated in FIG. 5, exerting a force from the side of the carrier tape 136 opposing the substrate 102, indicated by reference numeral 562. By doing so, the carrier tape 136 stretches, thereby exerting a separating force to the individual packages, as indicated by arrows 564. The force 562 may be applied using a block 566. Other methods, however, may be used, such as by using other shapes, moving a frame 568 holding the carrier tape 136, other methods of stretching the carrier tape, or the like.

As a result of using the modification layer 360 to cause a crack point rather than using a second saw process, a smaller saw blade may be used to form the notch 250, which in turn may result in a smaller kerf 567.

Figure 6B:
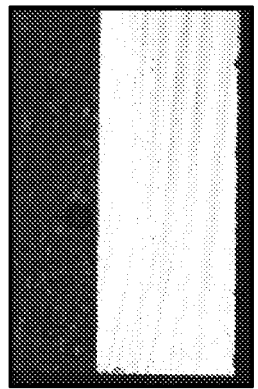
FIGS. 6a-6d illustrate compares devices formed in accordance with an embodiment.
Figure 6D:
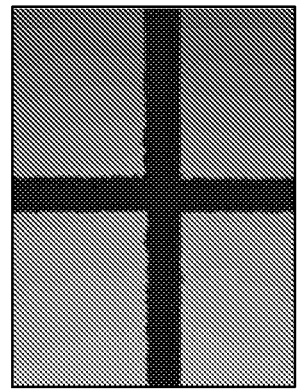
Figure 6A:
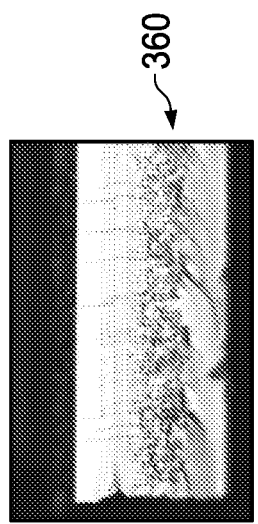

FIGS. 6a-6d illustrate differences between dice singulated with and without the modification layer 360. FIG. 6a illustrates a sidewall view wherein the modification layer is seen, whereas FIG. 6b illustrates a sidewall view using a laser ablation method without the modification layer. As illustrated, the sidewall view without the modification layer is generally uniform, wherein the laser used to create the modification layer alters the composition of the package. It has been found that the sidewall using the laser ablation method tends to be rough and prone to micro cracks that may lead to cracks or chipping. The sidewall of the substrate separated using a modification layer as discussed above tend to be relatively smooth and may tend to be less prone to cracking or chipping.

Figure 6C:
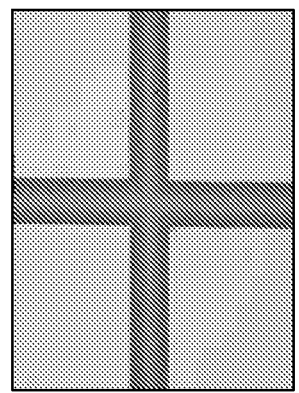

FIG. 6c illustrates a top view (bump side as opposed to the molding side) of a substrate fabricated using the modification layer. As can be seen, there is little or no chipping in this embodiment, particularly compared with the substrate fabricated without the modification layer that exhibits chipping up to about 15 μm illustrated in FIG. 6d.

As can be appreciated, embodiments such as those discussed above provide, after separation, a substrate having a modification layer formed therein along an edge of the separated substrate. The modification layer extends around the perimeter of the substrate, wherein the interior portion of the substrate is not affected, thereby retaining its original structural characteristics. For example, in an embodiment in which a crystalline silicon substrate is utilized, an amorphous region may be formed along a periphery of the substrate while the interior portions retain the crystalline aspects of the substrate.

Figure 7:
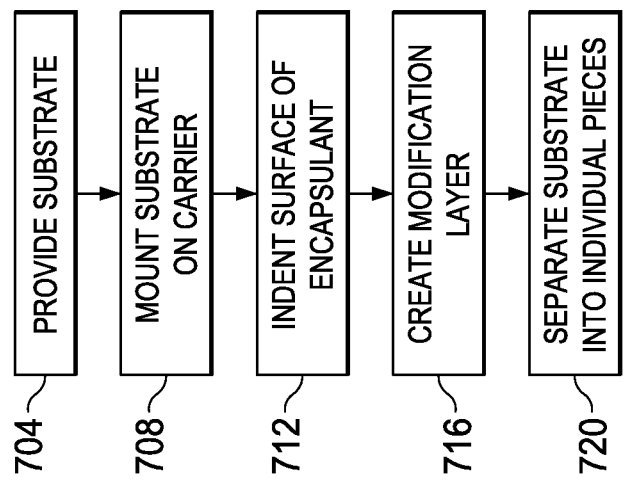
FIG. 7 is a flow chart illustrating a method of an embodiment.

FIG. 7 is a flow diagram of the method for dicing a substrate in accordance with an embodiment. In step 704, a substrate is provided. The substrate has a front and a rear surface and at least two package regions separated by a dicing line. In step 708, the substrate is mounted on a carrier, such as by attaching the substrate to a sticky surface of a carrier tape. Optionally, in step 712, the encapsulant is indented, such as sawing at least partially through a polymer molding layer. In step 716, a modification layer is created by, for example, a laser beam scanned through the carrier tape into the rear surface along the dicing line. In step 720, the substrate is separated into individual pieces. In an embodiment in which the carrier is a carrier tape, the separation may be performed by expanding the carrier tape to cause cracks extending from the modification layer toward the front and the rear surface.

In an embodiment, a method for dicing a substrate is provided. The method comprises providing a substrate having at least two device regions separated by a dicing line. A modification layer is formed below a surface of the substrate along the dicing line, and thereafter, pulling the substrate in opposing directions such that the substrate is pulled apart such that the substrate separates into multiple pieces along the dicing line.

In another embodiment, another method for dicing a substrate is provided. The method includes providing a substrate having a plurality of dice mounted thereon, the plurality of dice having an encapsulant formed therebetween with an indent between at least one adjacent pair of dice along a dicing line. A modification layer is formed in the substrate along the dicing line. Opposing forces are exerted along the dicing line.

In yet another embodiment, an electronic device is provided. The electronic device comprises a substrate having a modification layer formed therein along an edge of the substrate, the modification layer not extending around a perimeter of the substrate, the substrate above and below the modification layer being unmodified as compared to an interior portion of the substrate.

Having thus described the present disclosure by reference to certain of its embodiments, it is noted that the embodiments disclosed are illustrative rather than limiting in nature and that a wide range of variations, modifications, changes, and substitutions are contemplated in the foregoing disclosure and, in some instances, some features of the present disclosure may be employed without a corresponding use of the other features. Many such variations and modifications may be considered obvious and desirable by those skilled in the art based upon a review of the foregoing description of embodiments. Accordingly, it is appropriate that the appended claims be construed broadly and in a manner consistent with the scope of the disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for dicing a substrate, the method comprising:
   providing the substrate having at least two device regions separated by a dicing line, the substrate comprising a plurality of dice and an encapsulant between adjacent dice;
   forming a modification layer below a surface of the substrate along the dicing line;

sawing partially through the encapsulant such that a layer of the encapsulant remains over an interconnect structure along the dicing line, thereby forming an indent in the encapsulant between adjacent dice; and pulling, after the sawing, the substrate in opposing directions such that the substrate separates into multiple pieces along the dicing line.

2. The method of claim 1, wherein the forming the modification layer comprises scanning a laser beam along the dicing line, the laser beam being focused at an interior region of the substrate.

3. The method of claim 2, wherein the laser beam has a wavelength of about 1064 nm.

4. The method of claim 2, wherein the scanning comprises performing multiple scans of the laser beam, each scan being focused at a different depth in the substrate.

5. The method of claim 1, further comprising mounting the substrate on a carrier tape and wherein the pulling comprises stretching the carrier tape.

6. The method of claim 5, further comprising placing a plurality of bumps on the substrate, wherein the mounting the substrate comprises mounting the substrate on the carrier tape via the bumps.

7. The method of claim 1, wherein a portion of the encapsulant remains along a bottom of the indent.

8. The method of claim 7, wherein a thickness of the portion is about 5 μm to 10 μm.

9. A method for dicing a substrate, the method comprising:
providing the substrate having a plurality of dice mounted thereon, the plurality of dice having an encapsulant formed therebetween, the encapsulant having an indent between at least one adjacent pair of dice along a dicing line;

forming a modification layer in the substrate beneath the encapsulant extending over the dicing line; and exerting opposing separating forces along the dicing line.

10. The method of claim 9, wherein the indent is formed at least in part by sawing the encapsulant along the dicing line.

11. The method of claim 9, wherein a layer of encapsulant remains along a bottom of the indent.

12. The method of claim 9, wherein the exerting opposing separating forces comprises:
mounting the substrate on a carrier tape; and
stretching the carrier tape.

13. The method of claim 9, wherein the forming the modification layer comprises performing one or more scans of a laser along the dicing line.

14. The method of claim 13, wherein the laser has a wavelength of about 1064 nm.

15. An electronic device comprising:
a substrate, the substrate having a modification layer formed therein along an edge of the substrate, the modification layer not extending around a perimeter of the substrate, the substrate above and below the modification layer being unmodified as compared to an interior portion of the substrate;
one or more dice attached to the substrate; and
an encapsulant formed over the substrate alongside the one or more dice, the encapsulant extending laterally over the modification layer and to an edge of the substrate.

16. The electronic device of claim 15, wherein the modification layer comprises an amorphous region and the substrate comprises a crystalline material.

17. The electronic device of claim 15, wherein the substrate comprises an interposer.

18. The electronic device of claim 15, wherein the substrate comprises an integrated circuit wafer.

\* \* \* \* \*